(12) United States Patent
Cusinato et al.

(10) Patent No.: US 6,320,458 B1
(45) Date of Patent: Nov. 20, 2001

(54) INTEGRATED STRUCTURE WITH AN ANALOG UNIT SUPPLIED BY AN EXTERNAL SUPPLY VOLTAGE BY MEANS OF A LOW-PASS FILTER AND DRIVING ELEMENTS

(75) Inventors: Paolo Cusinato, Genoa; Gabriele Gandolfi; Vittorio Colonna, both of Pavia; Davide Tonietto, Milan, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/567,789

(22) Filed: May 9, 2000

(51) Int. Cl.[7] .................................................. G05F 3/02
(52) U.S. Cl. .................................... 327/543; 327/538
(58) Field of Search ........................... 327/540, 541, 327/543, 545, 546; 323/313

(56) References Cited

U.S. PATENT DOCUMENTS

| | | | |
|---|---|---|---|
| 4,893,029 | * 1/1990 | Matsuo et al. | 327/545 |
| 5,528,190 | * 6/1996 | Honnigford | 327/328 |
| 5,629,613 | * 5/1997 | Marzolf et al. | 323/315 |
| 5,721,484 | * 2/1998 | Ngo et al. | 323/313 |
| 5,910,725 | * 6/1999 | Gist | 323/313 |
| 5,920,469 | * 7/1999 | Harvey | 363/56 |
| 5,998,983 | * 12/1999 | Gerber | 323/313 |

* cited by examiner

Primary Examiner—Terry D. Cunningham
(74) Attorney, Agent, or Firm—Lisa K. Jorgenson; Allen, Dyer, Doppelt, Milbrath & Gilchrist, P.A.

(57) ABSTRACT

An integrated circuit has a first external supply terminal and a second external supply terminal for applying an external supply voltage to the circuit. The integrated circuit includes an analog unit supplied by at least one internal supply voltage derived from the external supply voltage, a low-pass filter connected to the first external supply terminal and to the second external supply terminal, and a driver connected between the low-pass filter and the analog unit for supplying the at least one internal supply voltage.

28 Claims, 2 Drawing Sheets

US 6,320,458 B1

INTEGRATED STRUCTURE WITH AN ANALOG UNIT SUPPLIED BY AN EXTERNAL SUPPLY VOLTAGE BY MEANS OF A LOW-PASS FILTER AND DRIVING ELEMENTS

FIELD OF THE INVENTION

The present invention relates to the field of semiconductors, and, more particularly, to integrated circuits.

BACKGROUND OF THE INVENTION

A circuit integrated in a chip of semiconductor material is typically supplied by an external supply voltage applied to corresponding terminals of the circuit. In some cases, the integrated circuit includes an analog unit which requires an extremely precise supply voltage with a very high (theoretically infinite) power-supply noise rejection (or PSNR). For example, an integrated circuit may be considered, in which there is a microprocessor and a phase-locked loop (or PLL) which generates an internal clock signal, derived from a corresponding external clock signal, for the microprocessor. The PLL includes a voltage-controlled oscillator (or VCO) which produces a signal having a frequency which depends on a control signal (a voltage) or, more precisely, on a difference between a supply voltage of the oscillator and the control signal.

A problem of this integrated circuit is that the external supply voltage (from which the supply voltage of the oscillator is derived) is subject to interference which is generated, for example, by digital circuits of the microprocessor (for example, during the switching of electronic switches) and which modifies the working frequency of the oscillator. In the example, this generates a skew between the external clock signal and the internal clock signal, with a consequent jitter defined as the difference, in absolute value, between the maximum advance skew and the maximum delay skew.

A known approach includes the use of a separate external supply voltage for the analog unit; however, this requires two additional supply terminals and considerably complicates a system in which the integrated circuit is connected. Another known approach provides for the use of a reference unit (for example, of the bandgap-based type) which is formed in the integrated circuit and can provide a supply voltage of very precise value, irrespective of interference and temperature variations. However, this reference unit is very complex (since it is typically formed by many transistors) and thus occupies a considerable space on the chip in which the integrated circuit is formed.

SUMMARY OF THE INVENTION

An object of the present invention is to overcome the above-mentioned drawbacks.

In order to achieve this and other objects, an integrated circuit having a first external supply terminal and a second external supply terminal for applying an external supply voltage to the circuit, is provided. The integrated circuit also comprises an analog unit supplied by at least one internal supply voltage derived from the external supply voltage, and includes a low-pass filter connected to the first external supply terminal and to the second external supply terminal. Furthermore, a driver is connected between the low-pass filter and the analog unit for supplying the at least one internal supply voltage.

Moreover, a corresponding method of supplying an analog unit formed in an integrated circuit is also provided.

BRIEF DESCRIPTION OF THE DRAWINGS

Further characteristics and the advantages of the integrated circuit according to the present invention will become clear from the following description of a preferred embodiment thereof, given by way of non-limiting example, with reference to the appended drawings, in which.

DETAILED DESCRIPTION OF THE PREFERRED EMBODIMENTS

Figure 1:
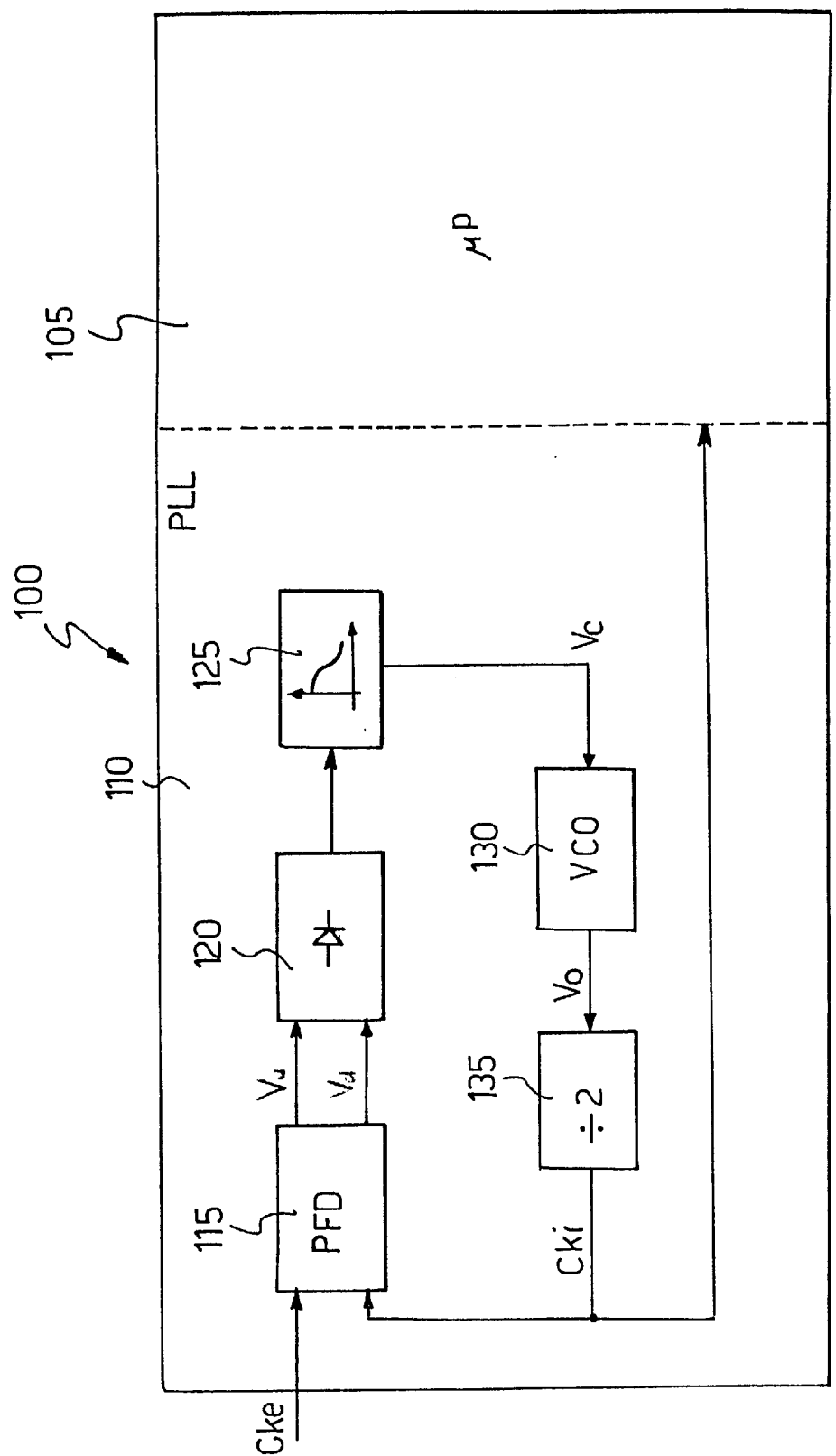
FIG. 1 is a block diagram of the integrated circuit according to the present invention.

With reference in particular to FIG. 1, an integrated circuit 100 (formed in a chip of semiconductor material), in which there is a microprocessor ($\mu$P) 105 and a PLL 110, is shown. The PLL 110 receives an external clock signal Cke and generates a corresponding internal clock signal Cki which is supplied to the microprocessor 105. The internal clock signal Cki has, for example, a frequency twice that of the external clock signal Cke and has a duty cycle of precisely 50%.

The PLL 110 includes a phase and frequency detector (or PFD) 115 which receives the external clock signal Cke and the internal clock signal Cki. The detector 115 generates two output signals Vu and Vd of constant amplitude and of a duration proportional to a phase difference, i.e., a delay or an advance, respectively, of the external clock signal Cke relative to the internal clock signal Cki. The signals Vu, Vd are applied as inputs to a charge pump 120 and to a low-pass filter 125 (connected in cascade) in order to generate a control signal Vc having an amplitude dependent on the signals Vu, Vd. The control signal Vc is applied to an input of a voltage-controlled oscillator (VCO) 130 to latch its working frequency to the frequency of the external clock signal Cke. An output signal Vo of the oscillator 130 is supplied to a frequency divider 135 (for example, dividing by 2), which generates the internal clock signal Cki (supplied to the detector 115 and to the microprocessor 105).

Of course, the present invention applies to a PLL having a different structure, can be used as a discriminator in a frequency-modulation system, etc. The present invention may also be used in an integrated circuit comprising an operational amplifier or any other analog unit which requires high power-supply noise rejection.

Figure 2:
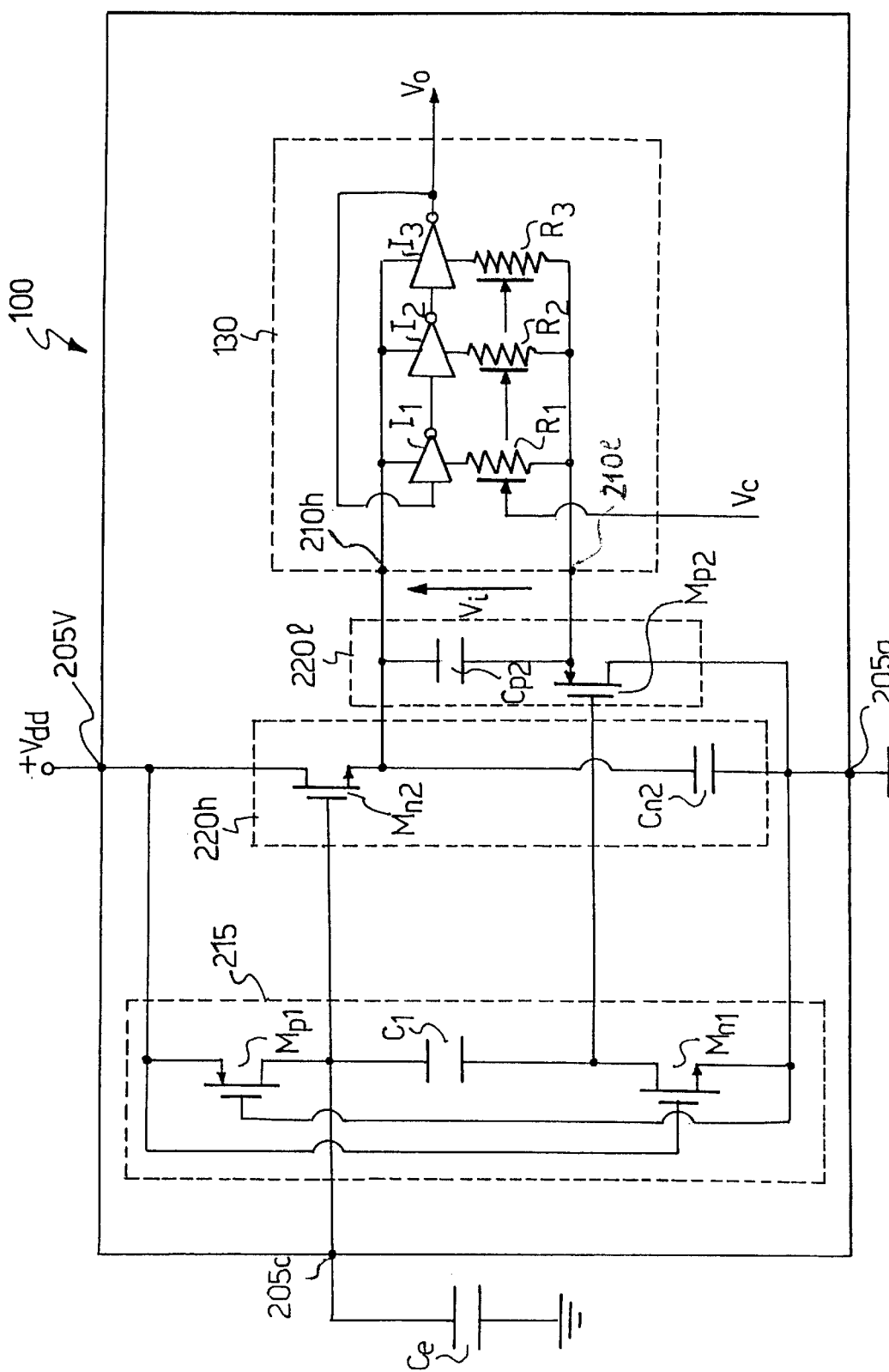
FIG. 2 is a schematic view of the oscillator with the respective supply circuit in accordance with the present invention.

With reference now to FIG. 2, the integrated circuit 100 has two external supply terminals 205g and 205v connected, respectively, to a reference terminal (or ground) and to a positive terminal of a supply +Vdd (the negative terminal of which is connected to the ground terminal), for example, equal to +3.3V. The oscillator 130 is a differential ring oscillator formed in CMOS technology. The oscillator 130 includes 3 inverting cells I1, I2 and I3, connected to one another in a ring with an output terminal of the last inverting cell I3 (which generates the output signal Vo) connected to an input terminal of the first inverting cell I1. The oscillator 130 has two internal supply terminals 210*l* and 210*h* to which an internal supply voltage Vi (for example equal to 1.5 V) is applied. Each of the inverting cells I1, I2 and I3 is connected directly to the internal supply terminal 210*h* and is connected to the internal supply terminal 210*l* by a respective regulating resistor R1, R2 or R3. The regulating resistors R1–R3 are typically formed by MOS transistors with the control signal Vc being applied to the gate terminals. These transistors have a resistance (between the source terminal and the drain terminal) which is variably dependent on the control signal Vc.

Each inverting cell I1–I3 has a propagation delay so that the oscillator generates a square wave having a frequency equal to twice the propagation delay multiplied by the number of inverting cells I1–I3. The propagation delay depends on the supply voltage of each inverting cell I1–I3 and can thus be adjusted by varying the resistance of the control resistors R1–R3 (and hence the voltage drop between their terminals) by the control signal Vc. Similar considerations apply if the supply voltage (external and internal) has a different value, if the oscillator is formed by a different number of inverting cells (in any case, an uneven number), is not differential, has a different structure, etc.

The oscillator 130 is supplied by a circuit comprising a low-pass filter 215 formed by an n-channel MOS transistor Mn1, a capacitor C1 (with a capacitance, for example, of 100 pF), and a p-channel MOS transistor Mp1. The transistor Mn1 has its source terminal connected to the external supply terminal 205g, its gate terminal connected to the external supply terminal 205v, and its drain terminal connected to a terminal of the capacitor C1. Similarly, the transistor Mp1 has its source terminal connected to the external supply terminal 205v, its gate terminal connected to the external supply terminal 205g, and its drain terminal connected to the other terminal of the capacitor C1.

The integrated circuit 100 preferably also has an external control terminal 205c connected to the drain terminal of the transistor Mp1. An external capacitor Ce (with a capacitance, for example, of a few nF) is connected between the external control terminal 205c and the ground terminal. The low-pass filter 215 has a differential output formed by the terminals of the capacitor C1. Respective driving elements 220l and 220h are connected between each output terminal of the low-pass filter 215 and the internal supply terminals 210l and 210h. The driving elements 220l, 220h operate as impedance separators and supply the current required by the oscillator 130.

In particular, the driving element 220h is formed by an n-channel MOS transistor Mn2 having its drain terminal connected to the external supply terminal 205v, its gate terminal connected to the drain terminal of the transistor Mp1, and its source terminal connected to the internal supply terminal 210h. Preferably, a capacitor Cn2 (with a capacitance, for example, of 10 pF) is connected between the internal supply terminal 210h and the external supply terminal 205g. The driving element 220l is formed by a p-channel MOS transistor Mp2, having its drain terminal connected to the external supply terminal 205g, its gate terminal connected to the drain terminal of the transistor Mn1, and its source terminal connected to the internal supply terminal 210l. A capacitor Cp2 is connected between the internal supply terminal 210l and the internal supply terminal 210h.

The transistors Mn1, Mp1 operate as resistors so that, in a steady state, the capacitor C1 is charged to the voltage +Vdd, while the voltage between the terminals of the transistors Mn1 and Mp1 (between the source and drain terminals) is zero. The voltage between the terminals of the capacitor C1 keeps the transistors Mn2 and Mp2 conductive with a fixed voltage between the gate terminal and the source terminal. The capacitors Cn2 and Cp2 are thus charged, bringing the circuit to an equilibrium condition in which the voltages at the internal supply terminals 210h and 210l are kept at constant values, for example, of 2.5 V and 1V, respectively. The internal supply voltage Vi between the internal supply terminals 210l and 210h is consequently also constant, at the value of 1.5V in the example in question.

It is now assumed that the external supply voltage +Vdd is subject to interference, represented, for example, by a voltage step of 0.3V (of a limited duration such as 50 ns). This interference is filtered by the low-pass filter 215. In particular, since the voltage between the terminals of the capacitor C1 cannot vary instantaneously, the interference is initially distributed to the terminals of the transistors Mn1 and Mp1. The voltage between the terminals of the capacitor C1 is thus modified with an exponential law, with a time constant which is directly proportional to the capacitance of the capacitor C1. The voltage at the gate terminals of the transistors Mn2, Mp2 is thus affected by the interference to a lesser extent, consequently reducing the variation in the internal supply voltage Vi.

The cut-off frequency of the low-pass filter 215 is limited at the lower end by the capacitance of the capacitor C1 which cannot adopt excessively high values. The external capacitor Ce (with a much higher capacitance) substantially reduces the lower cut-off frequency of the low-pass filter 215, enabling low-frequency interference (for example, below 1 kHz) to also be eliminated.

The capacitors Cn2, Cp2 form a further filter for this interference. In particular, the capacitors Cn2 and Cp2 shunt the interference towards the external supply terminals 205g and 205v, respectively. The capacitor Cp2 which is connected to the source terminal of the transistor Mn2 (and not directly to the external supply terminal 205v) is also affected by this interference to a reduced extent. This further filter intervenes, however, purely for interference of relatively high frequency since the capacitors Cn2, Cp2 have a low capacitance (substantially lower than that of the capacitor C1) to not excessively limit the frequency response of the oscillator 130 to the control signal Vc.

The integrated circuit of the present invention provides an extremely high power-supply noise rejection. This enables, for example, the skew between the external clock signal and the internal clock signal to be limited, with very low jitter. This result is achieved by a relatively simple circuit which occupies a limited space on the chip of semiconductor material in which the integrated circuit is formed.

Similar considerations apply if the oscillator does not have a differential structure (and the driving element 220l and the transistor Mn1 are therefore eliminated), if the low-pass filter is formed in a different manner, if the external capacitor is connected between the drain terminal of the transistor Mn1 and the supply terminal +Vdd, if other equivalent driving means are provided, etc. The integrated circuit of the present invention may, however, also be formed without an external control terminal, with different values of the capacitances of the capacitors C1, Cn2 and Cp2, with the capacitor Cp2 connected directly to the external supply terminal 205v, or without the capacitors Cn2 and Cp2.

The preferred embodiment described above is also particularly compact, since it uses a small number of simple transistors. Moreover, it enables the oscillator to be switched off very rapidly, simply by making the transistors Mn1 and Mp2 non-conductive. Similar considerations apply if the transistors Mn1, Mp2 are replaced by other equivalent resistive elements, if the capacitors C1, Cn2, Cp2 are formed by MOS transistors (or other equivalent elements), etc.

Naturally, in order to satisfy contingent and specific requirements, a skilled artisan may apply to the above-described integrated circuit many modifications and variations, all of which, however, are included in the scope of protection of the invention as defined by the appended claims.

That which is claimed:

1. A circuit comprising:
an integrated structure including
a first external supply terminal and a second external supply terminal for applying an external supply voltage,
an analog unit supplied by at least one internal supply voltage derived from the external supply voltage,
a low-pass filter connected to the first external supply terminal and to the second external supply terminal, and comprising a first capacitive element,
a control terminal connected to the first capacitive element of the low pass filter, and
a driving circuit connected between the low-pass filter and the analog unit for supplying the at least one internal supply voltage, the driving circuit comprising at least one filtering capacitive element for filtering the at least one internal supply voltage; and
an external capacitive element external to the integrated structure and connected to the control terminal, the external capacitive element having a higher capacitance than a capacitance of the first capacitive element of the low pass filter.

2. A circuit according to claim 1, wherein the analog unit is a differential type analog unit; wherein the at least one internal supply voltage comprises a first internal supply voltage and a second internal supply voltage; wherein the low-pass filter includes a first resistive element connected to the first external supply terminal, and a second resistive element connected to the second external supply terminal, with the first capacitive element connected between the first resistive element and the second resistive element; and wherein the driving circuit comprises a first driving element and a second driving element, each connected between the first capacitive element and the analog unit, for supplying the first internal supply voltage and the second internal supply voltage, respectively.

3. A circuit according to claim 2, wherein the first and second resistive elements comprise a first MOS transistor and a second MOS transistor, respectively, each of the first and second MOS transistors being connected to the first and second external supply terminals, and to the first capacitive element.

4. A circuit according to claim 2, wherein the analog unit includes a first internal supply terminal and a second internal supply terminal to which the first and second internal supply voltages are applied, respectively; and wherein each of the first and second driving elements includes a MOS transistor connected to one of the first and second external supply terminals, to the first capacitive element, and to one of the first and second internal supply terminals.

5. A circuit according to claim 4, wherein the at least one filtering capacitive element includes two filtering capacitive elements, wherein each of the first and second driving elements includes one of the two filtering capacitive elements, the filtering capacitive element of the first driving element being connected between the first internal supply terminal and the second internal supply terminal, and the filtering capacitive element of the second driving element being connected between the second internal supply terminal and the first external supply terminal.

6. A circuit according to claim 5, wherein each filtering capacitive element has a capacitance substantially lower than a capacitance of the first capacitive element.

7. A circuit according to claim 1, wherein the analog unit is a voltage-controlled oscillator.

8. A circuit according to claim 7, further comprising:
a digital unit supplied by the external supply voltage; and
a phase-locked loop defined by the voltage-controlled oscillator for generating an internal clock signal for the digital unit based upon an external clock signal.

9. A circuit comprising:
an integrated structure including
a first external supply terminal and a second external supply terminal for applying an external supply voltage,
a low-pass filter connected to the first external supply terminal and to the second external supply terminal, and comprising a first capacitive element,
a control terminal connected to the first capacitive element of the low pass filter,
a driving circuit connected to the low-pass filter for generating at least one internal supply voltage based upon the external supply voltage, the driving circuit comprising at least one filtering capacitive element for filtering the at least one internal supply voltage, and
an analog unit connected to the driving circuit and receiving the at least one internal supply voltage; and
an external capacitive element external to the integrated structure and connected to the control terminal, the external capacitive element having a higher capacitance than a capacitance of the first capacitive element of the low pass filter.

10. A circuit according to claim 9, wherein the analog unit is a differential type analog unit; wherein the at least one internal supply voltage comprises a first internal supply voltage and a second internal supply voltage; wherein the low-pass filter includes a first resistive element connected to the first external supply terminal, and a second resistive element connected to the second external supply terminal, with the first capacitive element connected between the first resistive element and the second resistive element; and wherein the driving circuit comprises a first driving element and a second driving element, each connected between the first capacitive element and the analog unit, for supplying the first internal supply voltage and the second internal supply voltage, respectively.

11. A circuit according to claim 10, wherein the first and second resistive elements comprise a first MOS transistor and a second MOS transistor, respectively, each of the first and second MOS transistors being connected to the first and second external supply terminals, and to the first capacitive element.

12. A circuit according to claim 10, wherein the analog unit includes a first internal supply terminal and a second internal supply terminal to which the first and second internal supply voltages are applied, respectively; and wherein each of the first and second driving elements includes a MOS transistor connected to one of the first and second external supply terminals, to the first capacitive element, and to one of the first and second internal supply terminals.

13. A circuit according to claim 12, wherein the at least one filtering capacitive element includes two filtering capacitive elements, wherein each of the first and second driving elements includes one of the two filtering capacitive elements, the filtering capacitive element of the first driving element being connected between the first internal supply terminal and the second internal supply terminal, and the filtering capacitive element of the second driving element being connected between the second internal supply terminal and the first external supply terminal.

14. A circuit according to claim 13, wherein each filtering capacitive element has a capacitance substantially lower than a capacitance of the first capacitive element.

15. A circuit comprising:
   an integrated structure including
      a first external supply terminal and a second external supply terminal for applying an external supply voltage,
      a low-pass filter connected to the first external supply terminal and to the second external supply terminal, and comprising a first capacitive element,
      a control terminal connected to the first capacitive element of the low pass filter,
      a driving circuit connected to the low-pass filter for generating at least one internal supply voltage based upon the external supply voltage, the driving circuit comprising at least one filtering capacitive element for filtering the at least one internal supply voltage,
      a digital unit supplied by the external supply voltage, and
      a phase-locked loop comprising a voltage-controlled oscillator connected to the driving circuit and receiving the at least one internal supply voltage for generating an internal clock signal for the digital unit based upon an external clock signal; and
   an external capacitive element external to the integrated structure and connected to the control terminal, the external capacitive element having a higher capacitance than a capacitance of the first capacitive element of the low pass filter.

16. A circuit according to claim 15, wherein the at least one internal supply voltage comprises a first internal supply voltage and a second internal supply voltage; wherein the low-pass filter includes a first resistive element connected to the first external supply terminal, and a second resistive element connected to the second external supply terminal, with the first capacitive element connected between the first resistive element and the second resistive element; and wherein the driving circuit comprises a first driving element and a second driving element, each connected between the first capacitive element and the phase locked loop, for supplying the first internal supply voltage and the second internal supply voltage, respectively.

17. A circuit according to claim 16, wherein the first and second resistive elements comprise a first MOS transistor and a second MOS transistor, respectively, each of the first and second MOS transistors being connected to the first and second external supply terminals, and to the first capacitive element.

18. A circuit according to claim 16, wherein the phase-locked loop includes a first internal supply terminal and a second internal supply terminal to which the first and second internal supply voltages are applied, respectively; and wherein each of the first and second driving elements includes a MOS transistor connected to one of the first and second external supply terminals, to the first capacitive element, and to one of the first and second internal supply terminals.

19. A circuit according to claim 18, wherein the at least one filtering capacitive element includes two filtering capacitive elements, wherein each of the first and second driving elements includes one of the two filtering capacitive elements, the filtering capacitive element of the first driving element being connected between the first internal supply terminal and the second internal supply terminal, and the filtering capacitive element of the second driving element being connected between the second internal supply terminal and the first external supply terminal.

20. A circuit according to claim 19, wherein each filtering capacitive element has a capacitance substantially lower than a capacitance of the first capacitive element.

21. A method of supplying an analog unit of an integrated circuit with an internal supply voltage, the method comprising:
   applying an external supply voltage to the integrated circuit;
   filtering the external supply voltage via a low-pass filter having a first capacitive element and a control terminal connected thereto;
   connecting an external capacitive element, external to the integrated circuit, to the control terminal, the external capacitive element having a higher capacitance than a capacitance of the first capacitive element of the low-pass filter to reduce a cut-off frequency thereof;
   generating at least one internal supply voltage, based upon the external supply voltage, via a driving circuit connected to the low-pass filter, the driving circuit including at least one filtering capacitive element for filtering the at least one internal supply voltage; and
   supplying the analog unit with the at least one internal supply voltage.

22. A method according to claim 21, wherein the analog unit is a differential type analog unit; wherein the at least one internal supply voltage comprises a first internal supply voltage and a second internal supply voltage; wherein the low-pass filter includes a first resistive element, and a second resistive element, with the first capacitive element connected between the first resistive element and the second resistive element; and wherein the driving circuit comprises a first driving element and a second driving element, each connected between the first capacitive element and the analog unit, for supplying the first internal supply voltage and the second internal supply voltage, respectively.

23. A method according to claim 22, wherein the first and second resistive elements comprise a first MOS transistor and a second MOS transistor, respectively.

24. A method according to claim 22, wherein the analog unit includes a first internal supply terminal and a second internal supply terminal to which the first and second internal supply voltages are applied, respectively; and wherein each of the first and second driving elements includes a MOS transistor.

25. A method according to claim 24, wherein the at least one filtering capacitive element includes two filtering capacitive elements, and wherein each of the first and second driving elements includes one of the two filtering capacitive elements.

26. A method according to claim 25, wherein each filtering capacitive element has a capacitance substantially lower than a capacitance of the first capacitive element.

27. A method according to claim 22, wherein the analog unit is a voltage-controlled oscillator.

28. A method according to claim 27, wherein the integrated circuit further comprises:
   a digital unit supplied by the external supply voltage; and
   a phase-locked loop defined by the voltage-controlled oscillator for generating an internal clock signal for the digital unit based upon an external clock signal.

* * * * *

UNITED STATES PATENT AND TRADEMARK OFFICE
CERTIFICATE OF CORRECTION

PATENT NO.    : 6,320,458 B1
DATED         : November 20, 2001
INVENTOR(S)   : Paolo Cusinato et al.

It is certified that error appears in the above-identified patent and that said Letters Patent is hereby corrected as shown below:

<u>Title page,</u>
Item [75], delete "Paolo Cusinato, Genoa" insert -- Paolo Cusinato, Genova --
Item [30], insert between Items [22] and [51] -- Foreign Application Priority Data, May 13, 1999 (IT)……………..MI99A001049 --

Signed and Sealed this

Eighteenth Day of March, 2003

JAMES E. ROGAN
*Director of the United States Patent and Trademark Office*